US011668736B2

(12) United States Patent
Alizadeh-Mousavi et al.

(10) Patent No.: US 11,668,736 B2
(45) Date of Patent: Jun. 6, 2023

(54) METHOD FOR DETERMINING SENSITIVITY COEFFICIENTS OF AN ELECTRIC POWER NETWORK USING METERING DATA

(71) Applicant: DEPSYS SA, Puidoux (CH)

(72) Inventors: Omid Alizadeh-Mousavi, Vevey (CH); Joël Jaton, Pully (CH)

(73) Assignee: KRAKENFLEX LIMITED, London (GB)

( * ) Notice: Subject to any disclaimer, the term of this patent is extended or adjusted under 35 U.S.C. 154(b) by 86 days.

(21) Appl. No.: 17/438,739

(22) PCT Filed: Jan. 29, 2020

(86) PCT No.: PCT/IB2020/050693
§ 371 (c)(1),
(2) Date: Sep. 13, 2021

(87) PCT Pub. No.: WO2020/183252
PCT Pub. Date: Sep. 17, 2020

(65) Prior Publication Data
US 2022/0155353 A1    May 19, 2022

(30) Foreign Application Priority Data
Mar. 13, 2019 (EP) .................... 19162669

(51) Int. Cl.
*G01R 19/25* (2006.01)
(52) U.S. Cl.
CPC ................. *G01R 19/2513* (2013.01)
(58) Field of Classification Search
CPC ............ G01R 19/2513; Y02E 60/00
(Continued)

(56) References Cited

U.S. PATENT DOCUMENTS

| 10,333,346 B2* | 6/2019 | Guo ................ H02J 3/12 |
| 2020/0003811 A1* | 1/2020 | Jaton ............... H04L 12/10 |
| 2020/0287388 A1* | 9/2020 | Alizadeh-Mousavi ...... H02J 3/381 |

FOREIGN PATENT DOCUMENTS

| CN | 107577870 | 1/2018 |
| DE | 4329103 | 3/1995 |

(Continued)

OTHER PUBLICATIONS

International Search Report and Written Opinion of the ISA for PCT/IB2020/050693, dated Mar. 23, 2020, 10 pages.

*Primary Examiner* — Giovanni Astacio-Oquendo
(74) *Attorney, Agent, or Firm* — Nixon & Vanderhye

(57) ABSTRACT

The present invention relates to the field of electric power networks, and it is more specifically concerned with a method for determining current sensitivity coefficients between several measuring nodes and selected branches in an electric power network without the knowledge of the network parameters. This method may be described as model-less or model-free since no data relating to network parameters needs to be used. In particular, the present invention should preferably be implemented in the form of a unified method for determining both current and voltage sensitivity coefficients. In this method, some or all of the power network nodes are measurement nodes equipped with metering units. The determined current sensitivity coefficients demonstrate the important behavior and characteristics of the power network which can be further used for the power network analysis, identification, operation, and control.

14 Claims, 10 Drawing Sheets

(58) Field of Classification Search
USPC .............................. 324/76.77, 500, 510, 511
See application file for complete search history.

(56) References Cited

FOREIGN PATENT DOCUMENTS

| WO | 2015/193199 | 12/2015 |
|---|---|---|
| WO | 2017/182918 | 10/2017 |

* cited by examiner

METHOD FOR DETERMINING SENSITIVITY COEFFICIENTS OF AN ELECTRIC POWER NETWORK USING METERING DATA

This application is the U.S. national phase of International Application No. PCT/IB2020/050693 filed 29 Jan. 2020, which designated the U.S. and claims priority to EP Patent Application No. 19162669.6 filed 13 Mar. 2019, the entire contents of each of which are hereby incorporated by reference.

The present invention concerns a method for determining sensitivity coefficients of an electric power network comprising a set of physical nodes and a set of physical branches, without the knowledge of the network parameters. The present invention is more specifically directed to a method for determining current sensitivity coefficients of a plurality of branches of an electric power network with respect to nodal active and reactive power variations at nodes of the network. The invention is optionally further directed to a unified method suited for determining both current and voltage sensitivity coefficients. The sensitivity coefficients of a power network are symptomatic of the specificities of the network's behavior. Accordingly, once sensitivity coefficients have been determined, the availability of this data can be made of use for various power network analysis and control applications.

BACKGROUND OF THE INVENTION

Knowledge of the electric power networks behavior and characteristics is a basic ingredient for all power system studies, such as network monitoring and state estimation, network optimal control and management, and network planning decisions.

The recent and emerging trends in the power market, namely i) growth of renewable energy production and distributed energy resources, ii) electrification of transportation and heating and cooling consumptions, and iii) access to flexibility of distributed controllable resource, have increased the need to monitor and analyze power networks more than ever, specifically for the distribution power networks in which the impacts of these trends are the most significant.

A further challenge to the analysis of distribution networks is that it is often the case that no accurate and up-to-date model of the network is available. A network model contains information such as for example: series and shunt impedances or conductances of branches, etc. The inaccuracy of such a model can be due to imperfect knowledge of the network topology (e.g. frequent changes of topology) and/or inaccurate network parameters (e.g. aging/damage of infrastructure, neglecting impedance of fuses/joints/connections). Hence, the automatic identification of network characteristics based on measurements of electrical quantities is very important for many smart grid applications, specifically for those applications with plug and play functionality.

The network current and voltage sensitivity coefficients both contain important information on the network's behavior and its characteristics. The current sensitivity coefficients reflect the variations of current at a particular branch with respect to power variations at all nodes and the voltage sensitivity coefficients reflect the variations of voltage at a particular node with respect to power variations at all nodes.

The sensitivity coefficients are used in many power system-related analysis and control approaches. In agreement with a currently widespread practice, patent document WO 2015/193199 A1 teaches to calculate the sensitivity coefficients using both the information of the network model and measurements. The network model information is used to construct the admittance matrix (or impedance matrix). Then, network analysis methods based on power flow analysis and its derivations (e.g. Jacobian matrix) are used to calculate the sensitivity coefficients using the network admittance matrix and measurements.

It should be noted that the estimation of the sensitivity coefficients using only measurement data and without relying on information contained in a model of the network has received some attention recently. Patent document WO 2017/182918 A1 discloses a method for determining mutual voltage sensitivity coefficients between a plurality of measuring nodes of an electric power network. The method comprises a step of performing multiple parametric regression analysis and uses an error correlation matrix taking into account negative first order autocorrelation to determine the mutual voltage sensitivity coefficients. This prior art method is based on the implicit assumption that only a single voltage measurement, a single current measurement and a single value of the phase difference between the voltage and the current suffice for determining the active power and the reactive power at a measuring node. In a more general case, multiple streams of electric current can be flowing simultaneously into or out of a particular measuring node through different branches that are incident on this measuring node. Furthermore, WO 2017/182918 A1 teaches that the time intervals separating successive measurements are preferably between 60 ms and 3 seconds. This corresponds to a measurement with relatively high reporting frequency, which might not be unavailable in the case of many monitoring infrastructures.

SUMMARY OF THE INVENTION

It is therefore an object of the present invention to alleviate the abovementioned problems in the prior art by providing a method for determining current sensitivity coefficients, and optionally for determining voltage sensitivity coefficients as well, according to which knowledge of the network parameters is not required. The invention achieves this object and others by providing a method for determining sensitivity coefficients of an electric power network according to the appended claim 1.

An electric power network comprises a set of physical nodes and a set of physical branches, each branch being arranged for connecting one node to another node. According to the invention, the electric power network further comprises a monitoring infrastructure comprising metering units provided at a selection of physical nodes of the network (in the following disclosure, physical nodes of the network that are equipped with at least one metering unit are called "measuring nodes"). Each metering unit is arranged to measure the voltage at a particular node (called the nodal voltage) and currents (called branch currents) flowing into or out of that particular node, the branch currents can either be currents flowing through branches that are incident on that particular node or currents associated with power injections at that particular node. The flows of active and reactive power through a branch that is incident on a particular measuring node are calculated from the nodal voltage and the branch current through that particular branch. Furthermore, the net sum of all the active branch power flowing into or out of a node is called the nodal active power. Similarly, the net sum of all the reactive power flowing into or out of a node is called the nodal reactive power. It follows that the active/reactive power consumed or produced at a particular node (i.e. the nodal active power and the nodal reactive power) can be calculated from the active and reactive branch powers respectively.

If the amount of the active/reactive power consumed or produced at a particular node of an electric power network changes, the currents at different location in the network change as well. However, the change in power affects some branches in the network more than others. The method of the invention allows for computing matrices of coefficients corresponding to the current sensitivities at particular branches (referred to as the selected branches) with respect to the variations of the nodal active and reactive powers at all of the measuring nodes in an electric power network, without requiring the knowledge of the network parameters. Knowledge of these current sensitivity coefficients allows in turn to predict the current changes at any one of the selected branches, when the amount of power consumed or produced at particular measuring node changes. This knowledge can then be used, for instance, for the power network analysis and/or the control of the network currents.

According to a preferred implementation of the method of the invention, it additionally determines mutual voltage sensitivity coefficients linking the nodal voltage variations at each one of the measuring nodes of the electric power network to the nodal active and reactive power variations at all measuring nodes of the network. One will understand in particular that the method of the invention allows to determine the mutual voltage sensitivity coefficients in addition to the current sensitivity coefficients without requiring any extra measured data.

If the amount of the active/reactive power consumed or produced at a particular node of an electric power network changes, the voltages at different location in the network change as well. However, the change in power affects some nodes in the network more than others. The preferred implementation of the method of the invention allows for computing matrices of coefficients corresponding to the voltage sensitivities linking the nodal voltage variations at each one of the measuring nodes to the nodal active and reactive power variations at all measuring nodes in an electric power network, without requiring the knowledge of the network parameters. Knowledge of these voltage sensitivity coefficients allows in turn to predict the voltage changes at any particular measuring node, when the amount of power consumed or produced at particular measuring nodes changes. This knowledge can then be used, for instance, for the power network analysis and/or the control of the network voltages.

According to a particular implementation of the method of the invention, the metering units at each one of said measuring nodes are arranged to measure timestamped sets of data comprising a mean value of the nodal voltage and mean values of the branch currents averaged over at least half a period of the AC power, and respective phase differences between the branch currents and the nodal voltage, and further to compute timestamped active branch powers and timestamped reactive branch powers from the nodal voltage, the branch currents and the phase differences contained in each timestamped set of data. It should be understood in particular that, in spite of the need for a monitoring infrastructure, implementation of the invention does not require highly synchronized measurements. In particular, the metering units do not need to be expensive Phasor Measurement Units (PMUs) having a permanent link to a common time reference, but can be conventional metering devices.

Some of the main advantages of the method of the invention are listed below:

Only time-stamped voltage, current, active power, and reactive power measurements are needed.

Synchrophasor measurements are not needed (only magnitudes of the electrical quantities are required and there is no need to the phasors and highly synchronized measurements).

There is no need for a model of the network and/or network parameters.

The method allows to implement a unified approach for the calculation of the voltage sensitivity coefficients and the current sensitivity coefficients.

The sensitivity coefficients are calculated using a limited amount of measurement data, for instance 2000 data points with 60-ms time step corresponding to 120 seconds or 2000 data points with 15-min time step corresponding to less than 21 days.

The algorithm is robust to the presence of noise in the measurements.

In the case where only a limited number of physical nodes of the electric power network are measuring nodes (i.e. nodes that are equipped with at least one measurement devices), the method determines the voltage and current sensitivity coefficients between the measuring nodes. In other words, the algorithm does not need to place measurement devices everywhere in the network.

BRIEF DESCRIPTION OF THE DRAWINGS

Other features and advantages of the present invention will appear upon reading the following description, given solely by way of non-limiting example, and made with reference to the annexed drawings, in which.

DETAILED DESCRIPTION OF AN EXEMPLARY IMPLEMENTATION

The subject matter of the present invention is a method for determining sensitivity coefficients of an electric power network. Accordingly, as the field to which the invention applies is that of electric power networks, an exemplary network will first be described. Actual ways in which the method can operate will be explained afterward.

Figure 1:
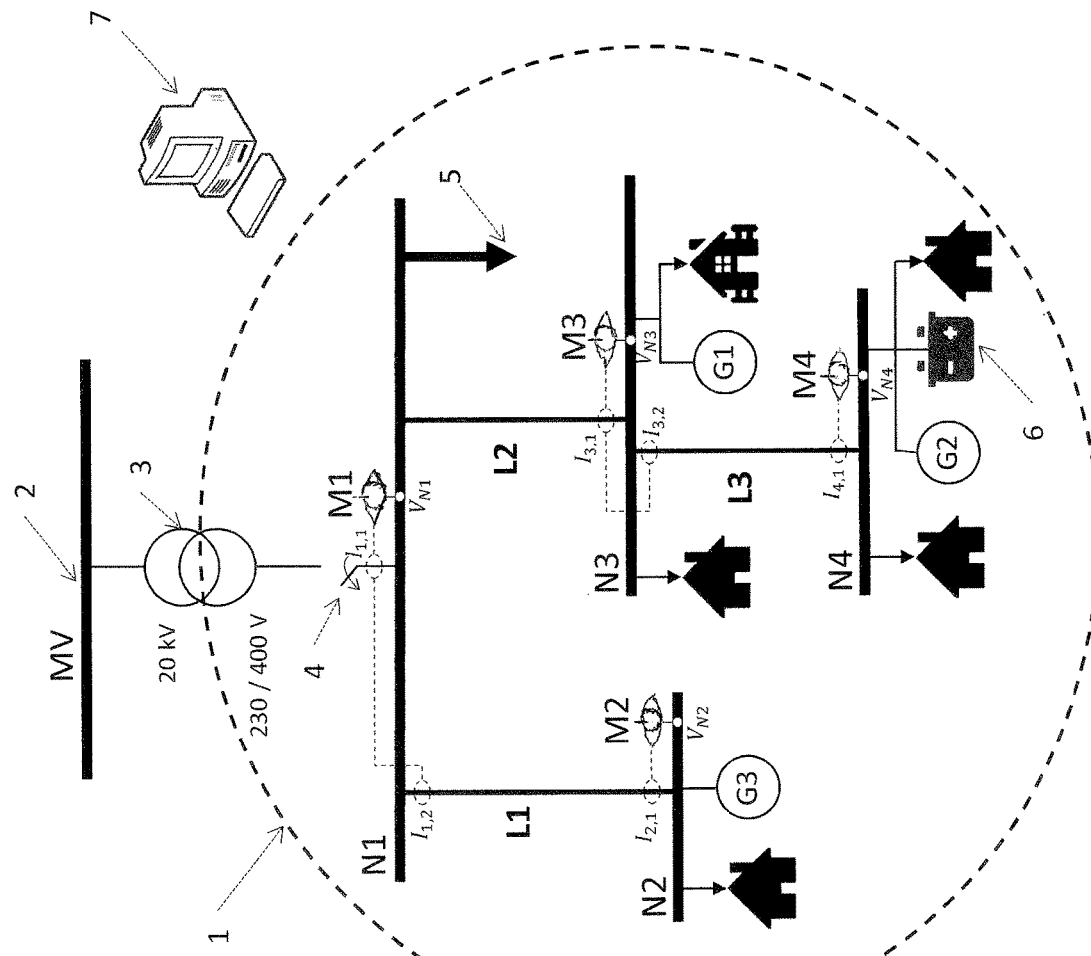
FIG. 1 is a schematic representation of an exemplary power distribution network that is used to explain particular implementation of the method of invention.

FIG. 1 is schematic representation of an exemplary low-voltage AC power distribution network (referenced 1) that is composed of 57 residential blocks, 9 agricultural buildings and supplies in total 88 customers. The low-voltage network 1 (230/400 Volts, 50 Hz) is linked to a medium voltage network 2 by a substation transformer 3. Table I below gives an idea of possible characteristics for the substation transformer in this particular example:

TABLE I

| Power | Uin | Uout | Coupling | Ucc | X/R |
|---|---|---|---|---|---|
| 250 kVA | 20 kV | 230/400 V | DYn11 | 4.1% | 2.628 |

The substation transformer is connected to network 1 through a switch 4 and a first node N1. In the network of the illustrated example, several feeder lines branch out from the node N1. One of these feeder lines (referenced L1) is arranged to link a residential block to the low-voltage network via a second node N2. Another feeder line (referenced L2) is arranged to link three residential and one agricultural building to the low-voltage network via a third node N3. It should be understood that the remaining residential blocks and agricultural buildings can be linked to the node N1 by other feeder lines that are not explicitly shown in FIG. 1 (but are represented as a whole by a single arrow referenced 5). As can be seen in FIG. 1, one residential block and one agricultural building are connected to the node N3. Furthermore, a feeder line L3 connects the node N3 to a forth node (referenced N4). Two residential blocks are connected to the node N4. Table II (next page) is intended to give an idea of possible characteristics for the feeder lines L1, L2, and L3 used in this particular example:

TABLE II

| | Cable type | Length | R/X [Ohm/km] | C [µF/km] |
|---|---|---|---|---|
| L1 | 1 kV 4 × 240 mm² AL | 48 m | 0.096; 0.072 | 0.77 |
| L2 | 1 kV 4 × 240 mm² AL | 145 m | 0.096; 0.072 | 0.77 |
| L3 | 1 kV 4 × 150 mm² AL | 65 m | 0.2633; 0.078 | 0.73 |

Still referring to FIG. 1, it can be seen that the network 1 further comprises three decentralized power plants. A first power plant (referenced G1) is a photovoltaic power plant connected to the node N3, a second power plant (referenced G2) is a photovoltaic power plant connected to the node N4, and the third power plant (referenced G3) is a diesel powered generator, which is linked to the node N2. As will be explained in more details further on, the third power plant is arranged to serve as a voltage reference generator when the power network 1 is operating in islanding mode. Table IIIA and IIIB (below) are intended to give an idea of possible characteristics for the three decentralized power plants used in this particular example:

TABLE IIIA

| PV Generators | Number of inverters | Voltage [kV] | Rated power [kVA] |
|---|---|---|---|
| G1 | 12 3-phase inverters | 0.4 | 196 |
| G2 | 3 3-phase inverters | 0.4 | 30 |

TABLE IIIB

| Diesel Generator | Voltage [kV] | Synchronous reactance [Ω] | Rated power [kVA] |
|---|---|---|---|
| G3 | 0.4 | 3.2 | 50 |

One can observe that, according to the present example, the photovoltaic power plants G1 and G2 provide a maximum power of 226 kVA. FIG. 1 also shows a battery pack (referenced 6) that is connected to the node N4 of the network 1. The combined presence of the three decentralized power plants, the battery pack 6 and the switch 4 offers the possibility of temporarily islanding the low-voltage network 1. Table IV bellow is intended to give an idea of possible characteristics for the battery pack 6 used in this particular example:

TABLE IV

| Type (technology) | c-rate | Energy [kWh] |
|---|---|---|
| Lithium Titanate | 1 | 40 |

Besides an electric power network, the physical environment within which the method of the invention is implemented also comprises a monitoring infrastructure. According to the invention, the monitoring infrastructure comprises metering units (referenced M1 through M4) provided at a selection of nodes of the network (in the following text, nodes of the network that are equipped with at least one metering unit are called "measuring nodes"). Measurements carried out by a group of metering units can be aggregated (for instance, the data of several smart meters downstream of a node can be aggregated and considered simply as originating from that particular measuring node). As previously mentioned, the exemplary low-voltage AC power network 1 illustrated in FIG. 1 is a three-phase electric power network. In such a case, a preferred implementation of the invention provides that the voltage and current are measured independently for each one of the three phases, and that the respective active and reactive powers are measured as well. This can be accomplished either by equipping each measuring node in the network with three single-phase metering units, or alternatively by using metering units designed for measuring three different phases independently.

FIG. 1 shows four metering units (referenced M1 through M4) located at four different measuring nodes. However, it should be understood that according to the invention, there could be any number of measuring nodes, possibly as few as two measuring nodes. Furthermore, concerning the particular network illustrated in FIG. 1, it should be understood that the remaining part of the network 1, which is not shown in detail, can possibly comprise additional measuring nodes. The metering units of the nodes N1 through N4 are each arranged for measuring, locally, at least a nodal voltage, a branch current flowing into or out of the node, and a phase difference between the nodal voltage and the branch current. Preferably, the metering units are arranged for measuring several branch currents flowing through different branches that are incident on the node. Referring again to FIG. 1, it can be seen that the first metering unit M1 is arranged to measure the nodal voltage of node N1 and the branch currents through the switch 4 as well as through the feeder line L1. The second metering unit M2 is arranged to measure the nodal voltage of node N2 and the branch current through the feeder line L1. The third metering unit M3 is arranged to measure the nodal voltage of node N3 and the branch currents through the feeder lines L2 and L3. Finally, the fourth metering unit M4 is arranged to measure the nodal voltage of node N4 and the branch current through the feeder line L3. One will understand from the above that, according to the present example, each of the nodes N1, N2, N2 and N4 is a measuring node.

According to the invention, the monitoring infrastructure further comprises a communication infrastructure arranged for allowing communication between the metering units and at least one processing unit 7. In the very schematic illustration of FIG. 1, the processing unit 7 is represented in the form of a computer placed at a distance from the network 1. One will understand however that the processing unit could be located at one of the measuring nodes. Indeed, according to a preferred embodiment of the monitoring infrastructure, the processing unit forms a part of one of the metering units. According to the illustrated example, the communication infrastructure does not comprise a dedicated transmission network but relies on the commercial cellular network provided by a mobile operator. One will understand however that according to alternative implementations, the communication infrastructure for the monitoring infrastructure could implement any type of communication that a person skilled in the art would consider adequate (including power line communication for example).

Figure 7:
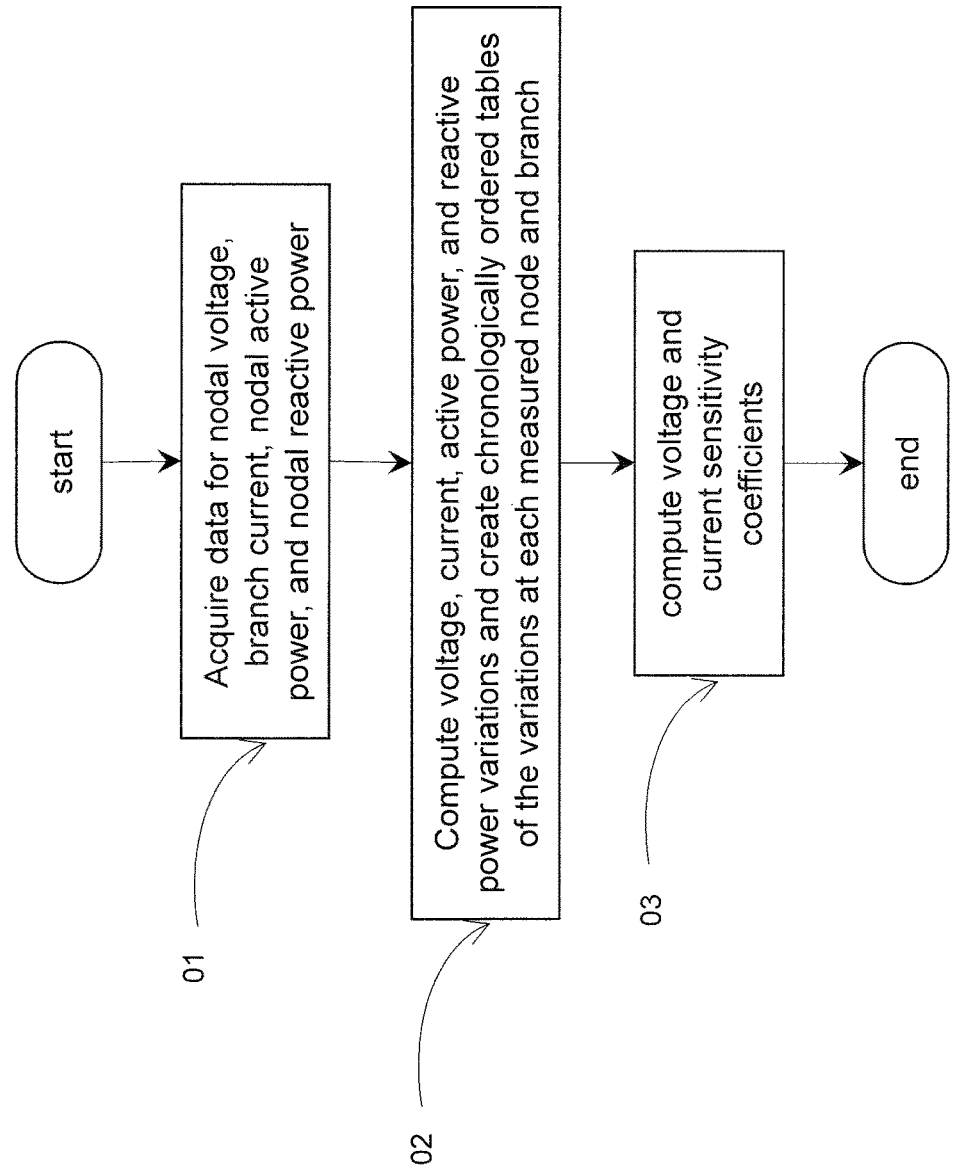
FIG. 7 is a flowchart depicting a first particular implementation of the method of the invention for determining the voltage and current sensitivity coefficients for an electric power network.

FIG. 7 is a flowchart depicting a first exemplary implementation of the method of the invention. According to this exemplary implementation, the method is used for determining both the voltage and the current sensitivity coefficients of an electric power network. The particularly undetailed flow chart of FIG. 7 comprises three boxes. The first box (referenced 01) generally represents a task consisting in acquiring a succession of values for the nodal voltages $V_n$, the branch currents $I_b$, the nodal active powers $P_n$, and the nodal reactive powers $Q_n$ at a plurality of measuring nodes in an electrical power network. For this purpose, the method of the invention uses a monitoring infrastructure arranged to measure the nodal voltages $V_n$ at each measuring node and the branch currents $I_b$ flowing into or out of the measuring nodes, and to calculate the nodal active powers $P_n$ and the nodal reactive powers $Q_n$ at several measuring nodes in the network repeatedly over a time period $\tau$. According to the invention, the electric power network is an AC power network, and according to the present exemplary implementation, the measured values for the voltage and the current are not instantaneous values, but average values (preferably RMS or TRMS values) measured over between at least a half period of the AC power and at most over 1-hour duration, preferably over between 3 periods of the AC power and 15-minutes duration.

Figure 6C:
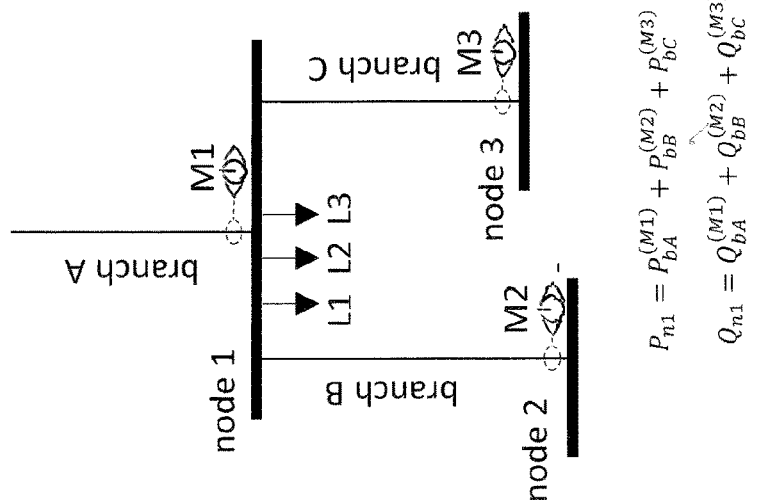
FIGS. 6A, 6B and 6C show different measuring configurations, as well an exemplary way of calculating the nodal power for each one of these configurations.
Figure 6B:
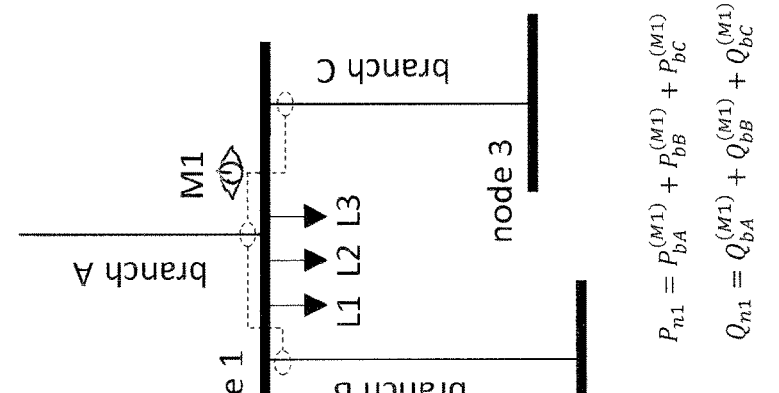
Figure 6A:
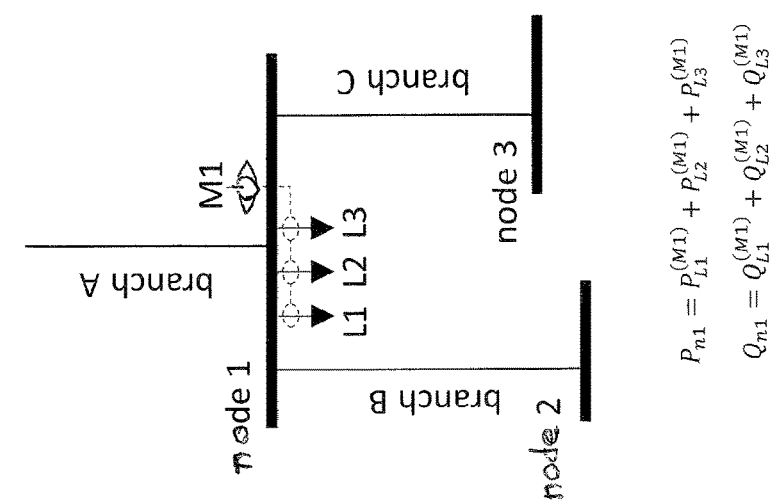

The active power and reactive power at each branch is then computed from locally measured values of the nodal voltage, the branch currents and the respective phase differences between the nodal voltage and branch currents. Then, the active/reactive power consumed or produced at a particular node (i.e. the nodal active power and the nodal reactive power) can be computed. The nodal active power is equal to the net sum of all the active power flowing through branches incident on that particular node, and the nodal reactive power is equal to the net sum of all the reactive power flowing through the same branches. As graphically illustrated in FIGS. 6A, 6B and 6C, the active and reactive powers of node 1 correspond to the aggregated production and consumption at node 1. It should be noted that, in the following disclosure, the expression "a power injection" can mean either the power produced by a generator connected to a particular node or the power consumed by a user who is connected to said particular node. According to this definition, the nodal powers are given by the net sum of the power injections L1, L2, and L3. In FIG. 6A, the metering unit M1 at node 1 directly measures the currents $I_{L1}$, $I_{L2}$ and $I_{L3}$ associated with the nodal injections and computes the corresponding power injections $P_{L1}^{(M1)}$, $Q_{L1}^{(M1)}$, $P_{L2}^{(M1)}$, $Q_{L2}^{(M1)}$, $P_{L3}^{(M1)}$ and $Q_{L3}^{(M1)}$. These power injection are then used to calculate the nodal power $P_{n1}$ and $Q_{n1}$ at node 1. In FIG. 6B, the metering unit M1 at node 1 measures the branch powers $P_{bA}^{(M1)}$, $P_{bB}^{(M1)}$ and $P_{bC}^{(M1)}$ flowing through branches A, B C respectively. The nodal power $P_{n1}$ at node 1 can be calculated as $P_{n1}=P_{bA}^{(M1)}+P_{bB}^{(M1)}+P_{bC}^{(M1)}$. In FIG. 6C, the metering unit M1 measures the branch current $I_{bA}^{(M1)}$ flowing through branch A and computes the branch power $P_{bA}^{(M1)}$ the metering unit M2 measures the branch current $I_{bB}^{(M2)}$ flowing through branch B and computes the branch power $P_{bb}^{(M2)}$, and finally the metering unit M3 measures the branch current flowing $I_{bC}^{(M3)}$ through branch C and computes the branch power $P_{bC}^{(M3)}$. Finally, the nodal power at node 1 can be calculated as $P_{n1}=P_{bA}^{(M1)}+P_{bB}^{(M2)}+P_{bC}^{(M3)}$. It should be understood that, in order to implement the particular strategy that has just been described, the system must be informed that branches B and C, which are both incident on node 1 at one of their ends, are incident at their other end on node 1 and node 2 respectively. In other words, some knowledge of the topology of the network is necessary in order to implement this strategy, although no further information is required. Finally, it follows from the above that, in the situation illustrated in FIG. 6C, the currents flowing into or out of node 1 through branch B and Branch C, are respectively equal to the branch current $I_{bB}^{(M2)}$ measured by the metering unit M2 at node 2 and to the branch current $I_{bC}^{(M3)}$ measured by the metering unit M3 at node 3. This equality is true provided that the effects of the series and shunt impedances of branches B and C on current flowing through these branches are negligible. Still referring to FIGS. 6A, 6B and 6C, we can summarize that there are two basic ways to compute the active and reactive nodal powers. A first way, described with reference to FIG. 6A, consists in computing each power injection at a particular node, and then calculating the nodal power of that particular node as the net sum of the power injections. The other way, described with reference to FIGS. 6B and 6C, consists in computing all the branch powers flowing into or out of a particular node through branches of the network that are incident on that particular node, and then calculating the nodal power of that particular node as the net sum of the branch powers.

Figure 2:
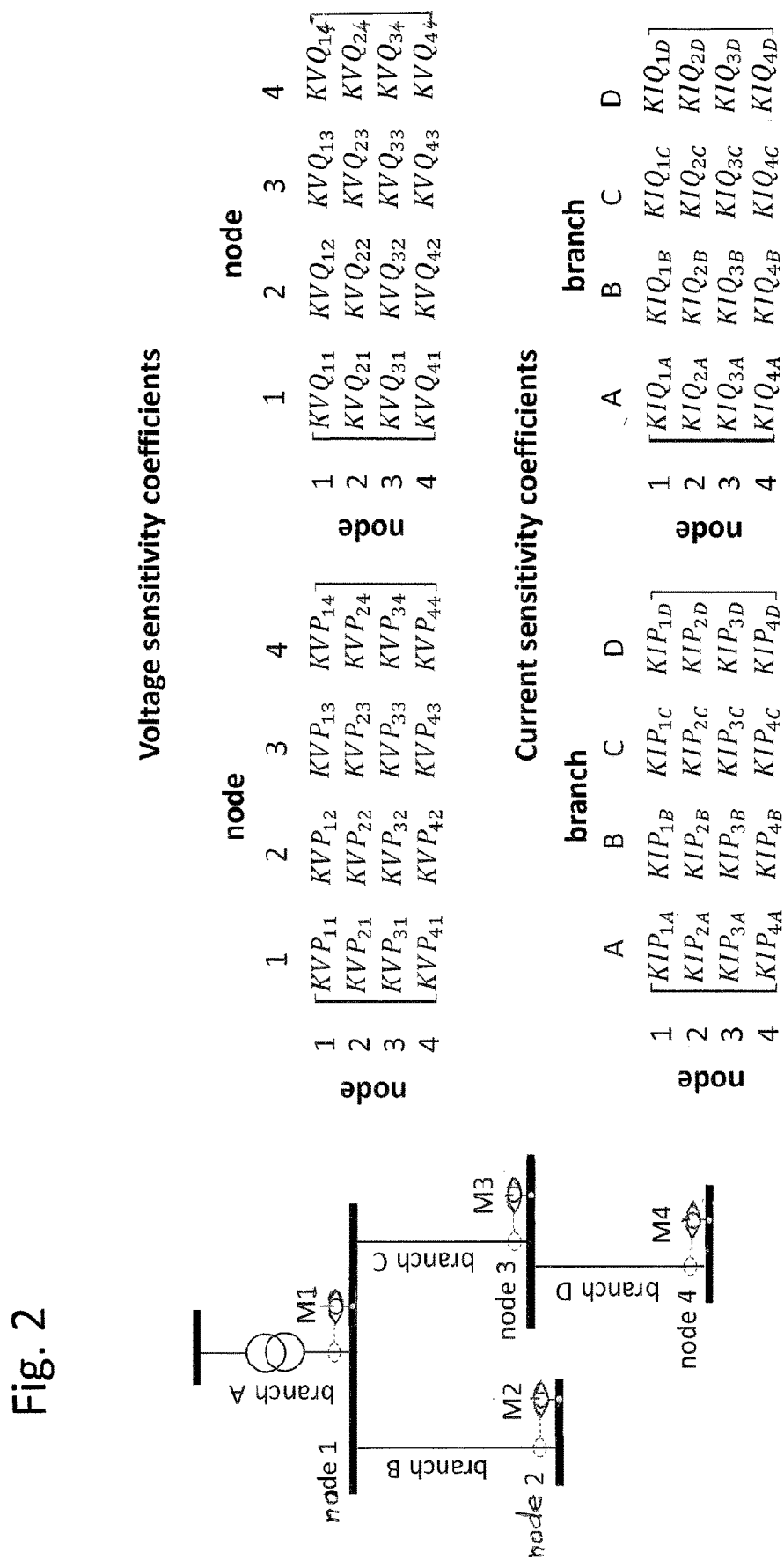
FIGS. 2, 3, and 4 show three alternative allocations of metering devices to the same exemplary electrical network, a well as the different resulting voltage and current sensitivity coefficient matrices.
Figure 3:
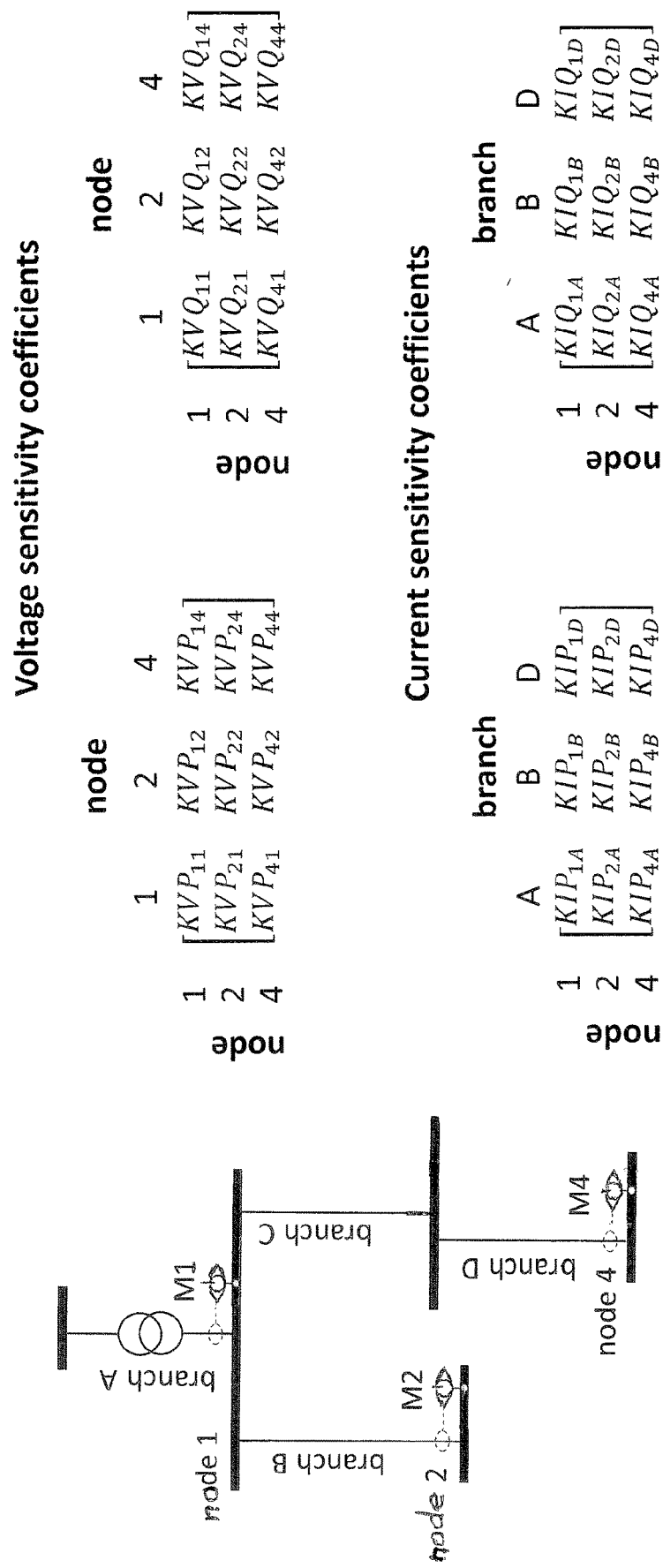
Figure 4:
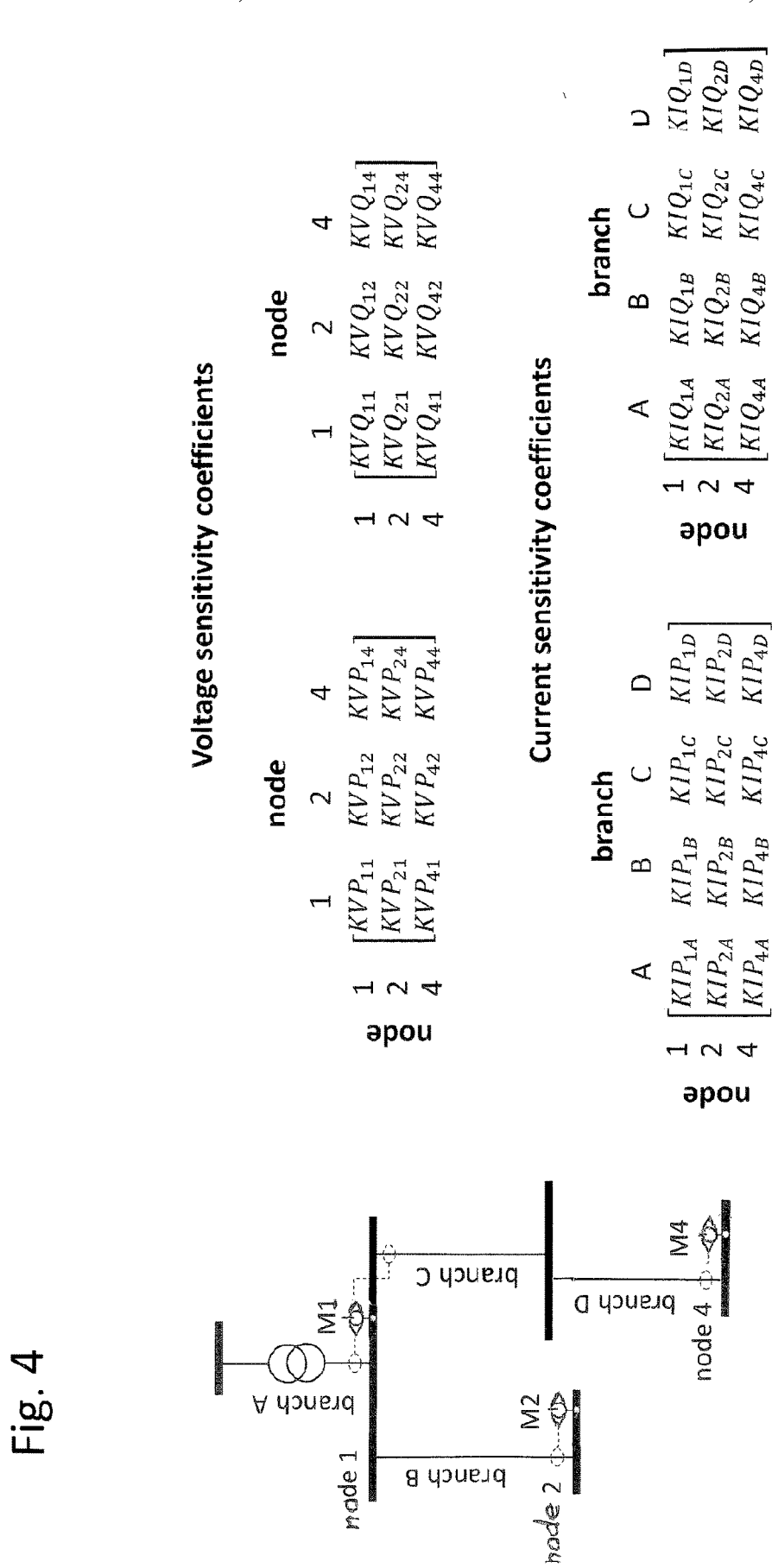

The method of the invention does not require that every physical node in the electric power network be a measuring node. Appended FIGS. 2, 3, and 4 show the same exemplary network comprising four nodes and four branches including one transformer and three feeder lines. FIG. 2 illustrates an exemplary case where 4 metering units have been allocated to the network (1 for at each physical node). As shown, the metering device at node 1, 2, 3, and 4 measure the voltage of the corresponding nodes and the current flowing through the branches A, B, C, and D, respectively. FIG. 3 shows another case where only 3 metering units have been allocated to the network. The metering device at node 1, 2, and 4 measure the voltage of the corresponding nodes and the current flowing through branches A, B, and D, respectively. However, there is no metering unit arranged at the remaining node. FIG. 4, shows another case where only 3 metering units have been allocated to the network. Similar to the previous case, the metering device at node 1, 2, and 4 measure the voltage of the corresponding nodes and the current flowing through branches A, B, and D, respectively. However, the metering device at node 1 also measures the current of the branch C. FIGS. 2, 3, and 4 each further contain the voltage and current sensitivity coefficient matrices corresponding to the illustrated deployment of metering units. In the case of FIG. 2, the voltage sensitivity coefficient matrix is a 4×4 matrix (measuring nodes×measuring nodes) and the current sensitivity coefficient matrix is a 4×4 matrix (measuring nodes×selected branches). In the case of FIG. 3, the voltage and current sensitivity coefficient matrices are 3×3 matrices reflecting the sensitivity coefficients between the metering units. In the case of FIG. 4, the voltage sensitivity coefficient matrix is a 3×3 matrix (measuring nodes×measuring nodes) and the current sensitivity coefficient matrix is a 3×4 matrix (measuring nodes×selected branches).

Figure 5:
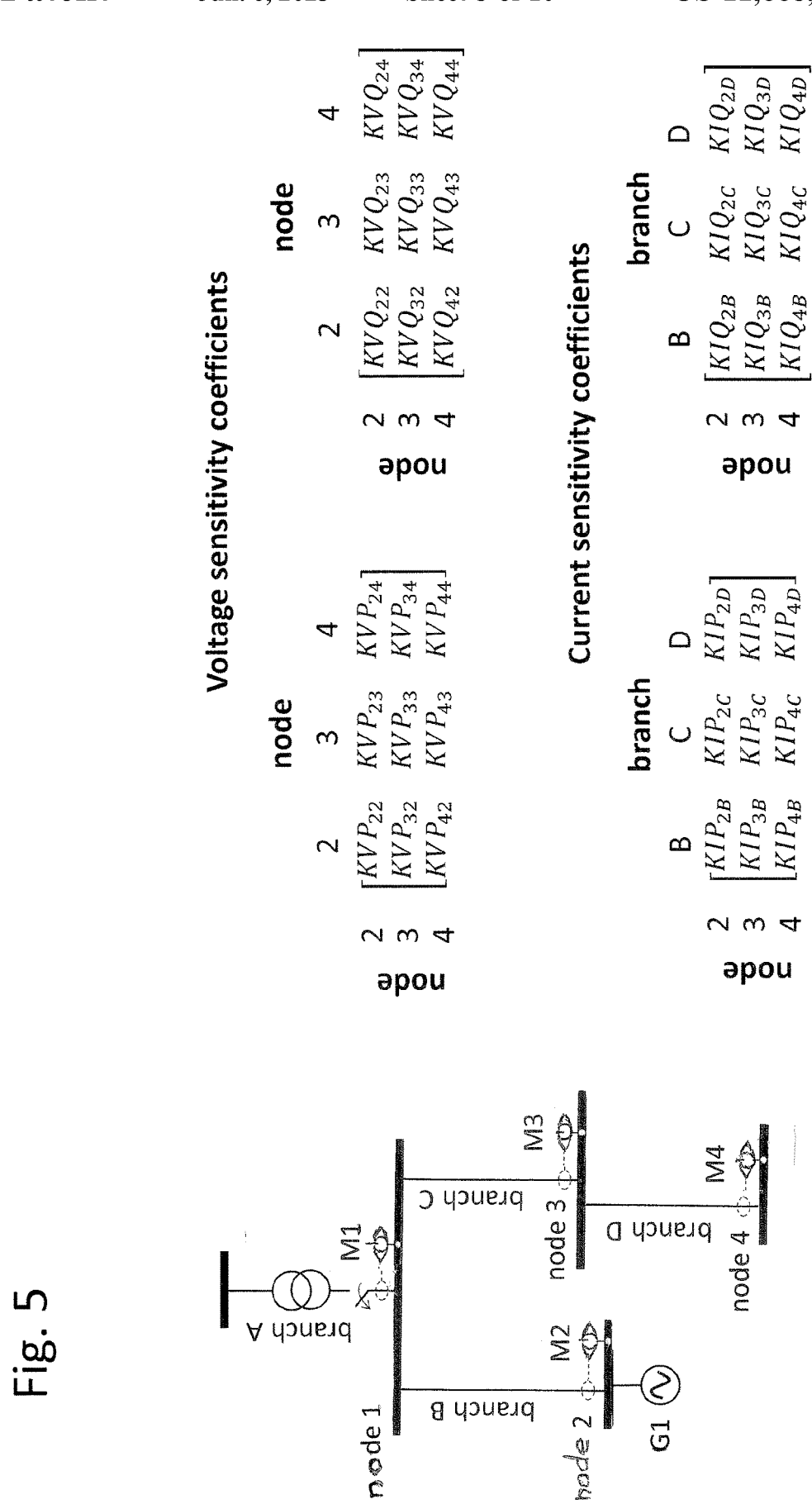
FIG. 5 shows an electrical network operating in islanding mode, as well as the corresponding voltage and current sensitivity coefficient matrices.

The method of the invention can also be used to determine the sensitivity coefficients when the network is operated in the islanding mode. For instance, appended FIG. 5 shows the network disconnected from the main grid by "switch" and operated in the islanding mode. It is assumed that generator "G1" is capable of controlling the network in the islanding operation mode and the node that the generator is connected to ("node 2") is considered as the slack node. In this case, the metering unit at "node 1" does not measure any current in branch A since the "switch" is open. The voltage sensitivity coefficient matrix is a 3×3 matrix (measuring nodes×measuring nodes) and the current sensitivity coefficient matrix is a 3×3 matrix (measuring nodes×selected branches).

According to the invention, the metering units arranged at different network nodes are able to provide timestamped voltage, current and power measurements with a time interval that can lie between 60-ms and 1-hour. The measurement data are timestamped by using a time reference signal, for instance GPS or NTP. Note that the method of the invention does not require that measurements of different metering units be highly synchronized. However, it does require that the metering units at different measuring nodes provide measurement values obtained approximately at the same time, or in other words it requires that measurements at different measuring nodes be made at times close enough together to allow subsequently treating the obtained values as being concomitant.

According to the presently described implementation of the invention, the different metering units in the network are synchronized by means of the Network Time Protocol (NTP) via the cellular network that serves as a communication network for the communication infrastructure. Advantages of NTP are that it is easy to implement and readily available almost everywhere. A known disadvantage of NTP is that it is not extremely precise. However, contrarily to what might be expected, experience shows that the synchronization provided by NTP is good enough for the method of the invention to produce satisfactory results. It should be understood however that NTP is not the only synchronization method usable with the method of the invention. In particular, according to a costlier implementation, the metering units can use a common time reference or a GPS synchronization.

According to the present exemplary implementation, the task of measuring the voltage of a particular measuring node, of measuring the currents through branches that are incident on that particular measuring node, and further of measuring the respective phase differences between the measured voltage and the currents, is carried by different metering units, which preferably also take care of the consequent calculation of the active and reactive powers. It should further be understood that the different metering units are synchronized to the extent discussed above. According to the present example, the metering units measure the current repeatedly, preferably at regular intervals, within a given time window. The number of successive measurements is preferably comprised between 200 and 5000 measurements, preferably between 1000 and 3000 measurements, for instance 2000 measurements. It should be understood however that the optimal number of measurements tends to increase as a function of the number of measuring nodes and branches. On the other hand, the optimal number of measurements tends to decrease with improving accuracy of the measurements provided by the metering units, as well as with improving accuracy of the synchronization between the metering units.

The second box (referenced 02) in the flow chart of FIG. 7 represents the task of computing, for each measuring node, concomitant variations of the nodal voltage and of the current and of the active and reactive powers, and further of compiling tables of the variations of the voltage at each one of the measuring nodes in relation to concomitant variations of the active and reactive powers at all measuring nodes as well as the variations of the current at each selected branch in relation to concomitant variations of the active and reactive powers at all measuring nodes. Concomitant variations of the measured voltage and current and of the active and reactive powers can be computed by subtracting from each set of concomitant values of the voltage, the current, the active power, and the reactive power respectively, the precedent values of the same variables. In other words, if two measurements by the same metering unit are available at times t and t+Δt:

a voltage variation $\Delta \tilde{V}_n(t)$ is computed for each measuring node as $\Delta \tilde{V}_n(t) = \tilde{V}_n(t+\Delta t) - \tilde{V}_n(t)$;

a current variation $\Delta \tilde{I}_b(t)$ is computed for each selected branch as $\Delta \tilde{I}_b(t) = \tilde{I}_b(t+\Delta t) - \tilde{I}_b(t)$;

an active power variation $\Delta \tilde{P}_n(t)$ is computed for each measuring node as $\Delta \tilde{P}_n(t) = \tilde{P}_n(t+\Delta t) - \tilde{P}_n(t)$;

a reactive power variation $\Delta \tilde{Q}_n(t)$ is computed for each measuring node as $\Delta \tilde{Q}_n(t) = \tilde{Q}_n(t+\Delta t) - \tilde{Q}_n(t)$;

where $n \in \{1, \ldots, N\}$, specifies a metering unit arranged at the n-th measuring node, and $b \in \{1, \ldots, B\}$ specifies the b-th selected branch. It should further be noted that, in the present description, quantities that correspond to measurements are denoted with tilde (i.e. $\tilde{V}$, $\tilde{I}$, $\tilde{P}$, and $\tilde{Q}$).

As previously mentioned, according to costlier implementations of the invention, the metering units could be PMUs synchronized by means of a permanent link to a common time reference (for example the GPS). In this case, both the amplitude and the phase of the voltage and current are measured. When information about the phase of the voltage and current is also available, it can be possible to decrease the number of necessary successive measurements by taking both the modulus and the phase of the voltage and current into account. Indeed, in this case, the measured voltage and current, given by $\tilde{V}_n(t)$ and $\tilde{I}_b(t)$, can be treated as a complex number, and the difference between two consecutive measurements can also be treated as a complex number. In this case, variations of the voltage and current, given by $\Delta\tilde{V}_n(t)$ and $\Delta\tilde{I}_b(t)$, are preferably computed as the modulus of the complex number corresponding to the difference between two consecutive measurements, or in other words, as the magnitude of the difference between two consecutive phasors.

Returning now to the first exemplary implementation of the invention, one will understand that, in order to compute the variations of voltage, current and active and reactive powers, the processing unit first accesses the communication network and downloads the timestamped values for the nodal voltages $\tilde{V}_n(t)$, the selected branch currents $\tilde{I}_b(t)$, the nodal active power $\tilde{P}_n(t)$, and the nodal reactive power $\widetilde{Q_n}(t)$ from the buffers of the different metering units. The processing unit then computes variations of the measured voltage, of the current, and of the active and the reactive powers by subtracting from each downloaded value of the voltage, of the current, of the active power and of the reactive power respectively, the value of the same variable carrying the immediately preceding timestamp. One should keep in mind in particular that the times $t \in \{t_1, \ldots, t_m\}$ refer to timestamps provided by different metering units. As, for example, $I_1(t_1)$ and $I_B(t_1)$ were computed from measurements out of different metering units, and that according to the first exemplary implementation their respective clocks were synchronized using NTP, measurements at time t should therefore be understood as meaning measurements at time t±a standard NTP synchronization error.

The processing unit then associates the timestamped variations of the selected branch currents $\Delta\tilde{I}_b(t)$ with the timestamped variations of the nodal active power $\Delta\tilde{P}_n(t)$ and the timestamped variation of the nodal reactive power $\Delta\widetilde{Q_n}(t)$ at all measuring nodes at the same measuring time. As exemplified by table V, the result can be represented as a set of B tables (where B stands for the number of selected branches) each table containing the variations of the current at a particular one of the selected branches b in relation to concomitant variations of the nodal active power and the nodal reactive power at all measuring nodes 1 to N. Similarly, the processing unit further associates each variation of the nodal voltage at one particular measuring node $\Delta\tilde{V}_n(t)$ with the variations of the nodal active power $\Delta\tilde{P}_n(t)$ and the variation of the nodal reactive power $\Delta\widetilde{Q_n}(t)$ at all measuring nodes at the same measuring time (where $t \in \{t_1, \ldots, t_n\}$ stands for a particular measuring time or timestamp). As exemplified by Table VI (below), the result can be represented as a set of N tables each containing the variations of the voltage at one particular measuring node n in relation to concomitant variations of the nodal active power and the nodal reactive power at all measuring nodes 1 to N. The timestamps $\{t1, \ldots, tm\}$ correspond to the successive measurement times. These measurement times cover a given time window $\tau=[t1, tm]$. According to the invention, m>2N, and preferably m»N.

TABLE V

| Branch current variation | Nodal active power variation | | | | Nodal reactive power variation | | | |
|---|---|---|---|---|---|---|---|---|
| $\Delta I_b(t_1)$ | $\Delta P_1(t_1)$ | $\Delta P_2(t_1)$ | ... | $\Delta P_N(t_1)$ | $\Delta Q_1(t_1)$ | $\Delta Q_2(t_1)$ | ... | $\Delta Q_N(t_1)$ |
| $\Delta I_b(t_2)$ | $\Delta P_1(t_2)$ | $\Delta P_2(t_2)$ | ... | $\Delta P_N(t_2)$ | $\Delta Q_1(t_2)$ | $\Delta Q_2(t_2)$ | ... | $\Delta Q_N(t_2)$ |
| ... | . | . | | . | . | . | | . |
| $\Delta I_b(t_m)$ | $\Delta P_1(t_m)$ | $\Delta P_2(t_m)$ | ... | $\Delta P_N(t_m)$ | $\Delta Q_1(t_m)$ | $\Delta Q_2(t_m)$ | ... | $\Delta Q_N(t_m)$ |

TABLE VI

| Nodal voltage variation | Nodal active power variation | | | | Nodal reactive power variation | | | |
|---|---|---|---|---|---|---|---|---|
| $\Delta V_n(t_1)$ | $\Delta P_1(t_1)$ | $\Delta P_2(t_1)$ | ... | $\Delta P_N(t_1)$ | $\Delta Q_1(t_1)$ | $\Delta Q_2(t_1)$ | ... | $\Delta Q_N(t_1)$ |
| $\Delta V_n(t_2)$ | $\Delta P_1(t_2)$ | $\Delta P_2(t_2)$ | ... | $\Delta P_N(t_2)$ | $\Delta Q_1(t_2)$ | $\Delta Q_2(t_2)$ | ... | $\Delta Q_N(t_2)$ |
| ... | . | . | | . | . | . | | . |
| $\Delta V_n(t_m)$ | $\Delta P_1(t_m)$ | $\Delta P_2(t_m)$ | ... | $\Delta P_N(t_m)$ | $\Delta Q_1(t_m)$ | $\Delta Q_2(t_m)$ | ... | $\Delta Q_N(t_m)$ |

The third box (referenced 03) in the flow chart of FIG. 7 represents the task of statistically estimating the voltage sensitivity coefficients linking the nodal voltage variations measured at a particular node to the nodal active and reactive powers at all measuring nodes as well as estimating the current sensitivity coefficients linking the branch current variations at a particular one of the selected branches to the nodal active and reactive powers at all measuring nodes.

The set of voltage sensitivity coefficients obtained from the data of Table V and the set of current sensitivity coefficients obtained from the data of Table VI are preferably obtained by means of the Maximum Likelihood Estimation (MLE) method. The voltage sensitivity coefficients can be grouped in such a way as to form a voltage sensitivity coefficient matrix and the current sensitivity coefficients can be grouped in such a way as to form a current sensitivity coefficient matrix.

In this case, the voltage sensitivity coefficients $KVP_{nn}$ and $KVQ_{nn}$ can be interpreted as estimations of the values of the partial derivatives given below $$KVP_{nn} \triangleq \frac{\partial V_n}{\partial P_n}; \quad KVQ_{nn} \triangleq \frac{\partial V_n}{\partial Q_n} \quad (1)$$

In other words, knowing the voltage sensitivity coefficients, the voltage variation at node n, given by $\Delta \tilde{V}_n$, can be determined by equation (2) and using the nodal active and reactive power changes at all nodes n given by $\Delta \tilde{P}_n(t)$ and $\Delta \tilde{Q}_n(t)$.

$$\Delta \tilde{V}_n(t) = \sum_n KVP_{nn} \Delta \tilde{P}_n(t) + \sum_n KVQ_{nn} \Delta \tilde{Q}_n(t) \quad (2)$$

Similarly, the current sensitivity coefficients $KIP_{bn}$ and $KIQ_{bn}$ can be interpreted as estimations of the values of the partial derivatives given below.

$$KIP_{bn} \triangleq \frac{\partial I_b}{\partial P_n}; \quad KIQ_{bn} \triangleq \frac{\partial I_b}{\partial Q_n} \quad (3)$$

In other words, knowing the current sensitivity coefficients, the current variation at branch b, given by $\Delta \tilde{I}_b$, can be determined by equation (4) and using the nodal active and reactive power changes at all nodes n given by $\Delta \tilde{P}_n(t)$ and $\Delta \tilde{Q}_n(t)$.

$$\Delta \tilde{I}_b(t) = \sum_n KIP_{bn} \Delta \tilde{P}_n(t) + \sum_n KIQ_{bn} \Delta \tilde{Q}_n(t) \quad (4)$$

According to Maximum Likelihood Estimation, the voltage sensitivity coefficients of each measuring node can be obtained as the result of following optimization problem or its convex reformulation:

$$\min_{\Omega} \sum_t \left\| \Delta \tilde{V}_n(t) - \Delta \bar{V}_n(t) \right\|_k \quad (5)$$

s.t.

$$\Delta \bar{V}_n(t) = \sum_n (KVP_{nn} \Delta \tilde{P}_n(t) + KVQ_{nn} \Delta \tilde{Q}_n(t))$$

where $\Delta \tilde{V}_n(t)$ is the measured voltage variation and $\Delta \bar{V}_n(t)$ is the estimated voltage variation without noise, and $\Omega = \{KVP_{nn}, KVQ_{nn}, \Delta \bar{V}_n(t)\}$.

Similarly, the current sensitivity coefficients of each selected branch can be obtained as the result of following optimization problem or its convex reformulation:

$$\min_{\Omega} \sum_t \left\| \Delta \tilde{I}_b(t) - \Delta \bar{I}_b(t) \right\|_k \quad (6)$$

s.t.

$$\Delta \bar{I}_b(t) = \sum_n (KIP_{bn} \Delta \tilde{P}_n(t) + KIQ_{bn} \Delta \tilde{Q}_n(t))$$

where $\Delta \tilde{I}_b(t)$ is the measured current variation and $\Delta \bar{I}_b(t)$ is the estimated current variation without noise, and $\Omega = \{KIP_{bn}, KIQ_{bn}, \Delta \bar{I}_b(t)\}$.

A person skilled in the field will understand that the objectives of the optimization problems in (5) and (6) are the k-norm function $\|\ \|_k$, where k can be equal to 1 representing the absolute value for the objective function ($\|\ \|_1$ or $|\ |$) or k can be equal to 2 representing a quadratic objective function ($\|\ \|_2$ or $\|\ \|$). A person skilled in the field understands that the minimization of the absolute value in the objective function can be reformulated as a convex and linear objective function. Furthermore, a person skilled in the field will also understand that the active power variation $\Delta \tilde{P}_n(t)$ and the reactive power variation $\Delta \tilde{Q}_n(t)$ can be considered as the measurements with noise and corresponding terms can be incorporated into the objective functions.

Due to the statistical nature of the method, individual measured values tend to deviate to some extent from their predicted value. Accordingly, each measured voltage variation equals the corresponding estimated voltage variation plus/minus an error term, as given in (7), where $\omega_n(t)$ is the error term. Similarly, each measured current variation equals the corresponding estimated current variation plus/minus an error term, as given in (8), where $\omega_b(t)$ is the error term.

$$\Delta \tilde{V}_n(t) = \Delta V_n(t) \pm \omega_n(t) \quad (7)$$

$$\Delta \tilde{I}_b(t) = \Delta I_b(t) \pm \omega_b(t) \quad (8)$$

According to the invention, the Maximum Likelihood Estimation (MLE) takes negative first-order autocorrelation into account. This means that the MLE assumes that a substantial negative correlation exists between the errors $\omega_n(t)$ and $\omega_n(t+\Delta t)$, where t and t+$\Delta t$ are two consecutive time-steps. In the present description, the expression a "substantial correlation" is intended to mean a correlation, the magnitude of which is at least 0.3, is preferably at least 0.4, and is approximately equal 0.5 in the most favored case.

According to preferred implementations of the invention, the MLE further assumes that no substantial correlation exists between the errors from two non-consecutive time-steps. The expression "no substantial correlation" is intended to mean a correlation, the magnitude of which is less than 0.3, preferably less than 0.2, and approximately equal to 0.0 in the most favored case. Accordingly, the correlation between the errors in two non-consecutive time steps is contained in the interval between −0.3 and 0.3, preferably in the interval between −0.2 and 0.2, and it is approximately equal to 0.0 in the most favored case. As the number of successive measurements is m, there are m−1 error terms $\omega_n(t)$ for each metering unit, and therefore (m−1)×(m−1) error correlation terms.

Figure 8:
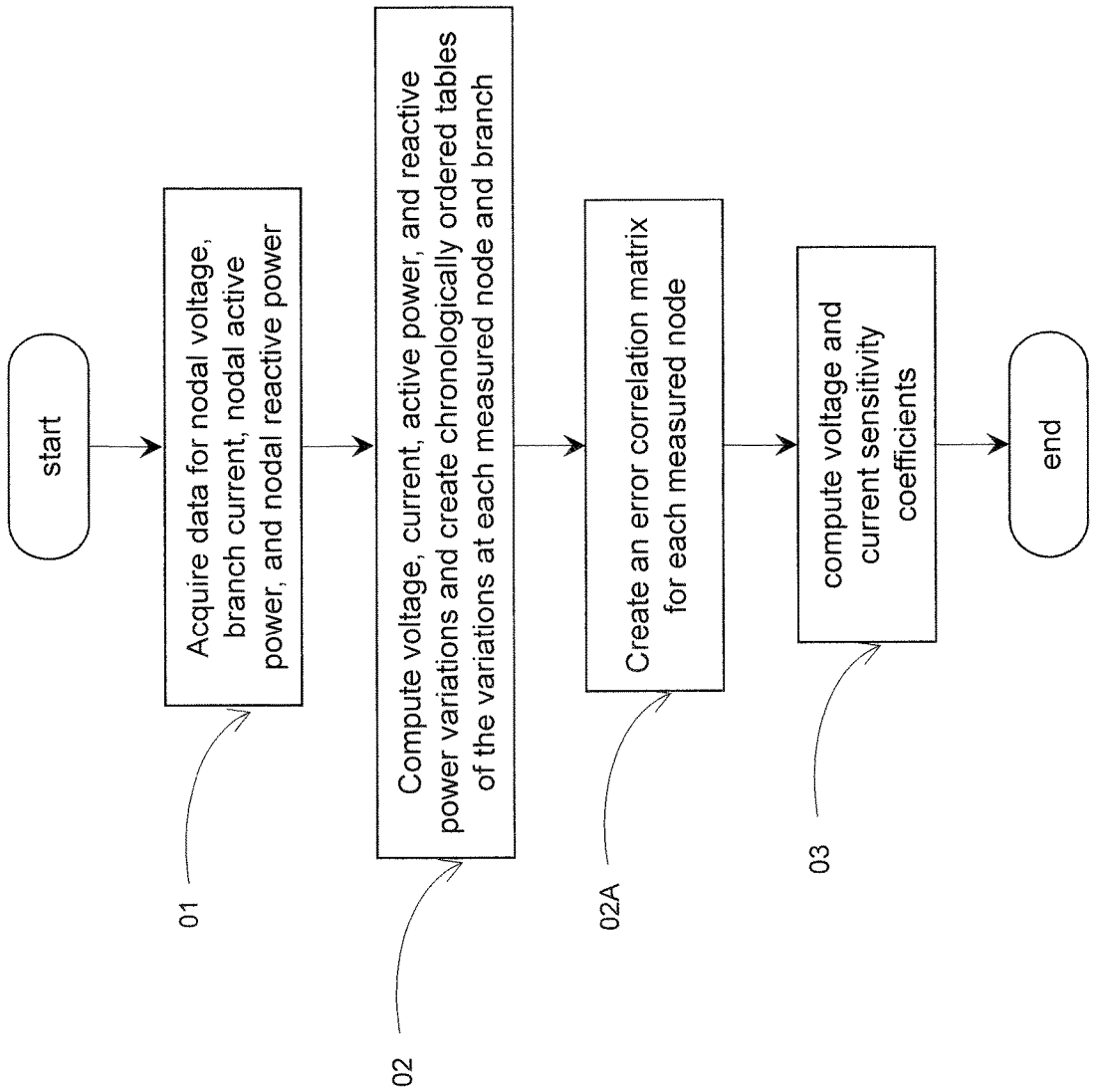
FIG. 8 is a flowchart depicting a second particular implementation of the method of the invention for determining the voltage and current sensitivity coefficients for an electric power network.

FIG. 8 is a flowchart depicting a particular variant of the implementation illustrated by the flowchart of FIG. 7. According to the illustrated variant, the Maximum Likelihood Estimation is implemented in the form of multiple linear regression. To be even more specific, the particular type of multiple linear regression that is implemented is "generalized least squares". The generalized least squares method allows obtaining the voltage sensitivity coefficient matrices analytically by solving the equation (9) for each measuring node. Similarly, the generalized least squares method allows obtaining the current sensitivity coefficient matrices analytically by solving the equation (10) for each selected branch.

$$(KVP_{nn}, KVQ_{nn}) = (\Delta(\tilde{P}_n, \tilde{Q}_n)^T \Sigma_{mm}^{-1} \Delta(\tilde{P}_n, \tilde{Q}_n))^{-1} (\Delta(\tilde{P}_n, \tilde{Q}_n))^T \Sigma_{mm}^{-1} \Delta \tilde{V}_n \quad (9)$$

$$(KIP_{bn}, KIQ_{bn}) = (\Delta(\tilde{P}_n, \tilde{Q}_n)^T \Sigma_{mm}^{-1} \Delta(\tilde{P}_n, \tilde{Q}_n))^{-1} (\Delta(\tilde{P}_n, \tilde{Q}_n))^T \Sigma_{mm}^{-1} \Delta \tilde{I}_b \quad (10)$$

where $\Sigma_{mm}$ is the correlation matrix for taking the impact of measurement noise into account with first order autocorrelation.

The results of the generalized least square multiple linear regression method is the same as the Maximum Likelihood Estimation (MLE) if the error, i.e. $\omega_n(t)$, follows a multivariate normal distribution with a known covariance matrix. The error correlation matrices $\Sigma_{mm}$ are preferably not pre-loaded into the processing unit, but created only once the table of the variations of the measured voltage (Table V) and of the measured current (Table VI) have been created (box 02). Indeed, the size of the (m−1) by (m−1) error correlation matrices is determined by the length m−1 of the table of the variations of the measured current. Accordingly, the variant of FIG. 8 comprises an additional box 02A not present in FIG. 7. Box 02A comprises the task of creating the error correlation matrix for the metering unit. The presence of this additional box after box 02 has the advantage of allowing for adapting the method to the case where the set of data associated with one particular timestamp is missing.

In the present example, as is the case with any correlation matrix, the entries in the main diagonal of each one of the N (m−1) by (m−1) correlation matrices are all chosen equal to 1. According to the invention, the entries in both the first diagonal below, and the first diagonal above this, are all comprised between 0.7 and −0.3, and finally all other entries are comprised between −0.3 and 0.3. In the present particular example, the correlation coefficients of the errors between two non-consecutive time-steps are equal to zero, and the correlation coefficients of the errors between two consecutive time-steps are assumed to be −0.5. In this case the error correlation matrices correspond to the tridiagonal matrix shown below:

$$\Sigma = \begin{pmatrix} 1 & -0.5 & & & \\ -0.5 & \ddots & \ddots & & 0 \\ & \ddots & \ddots & \ddots & \\ & 0 & \ddots & \ddots & -0.5 \\ & & & -0.5 & 1 \end{pmatrix}$$

Figure 9:
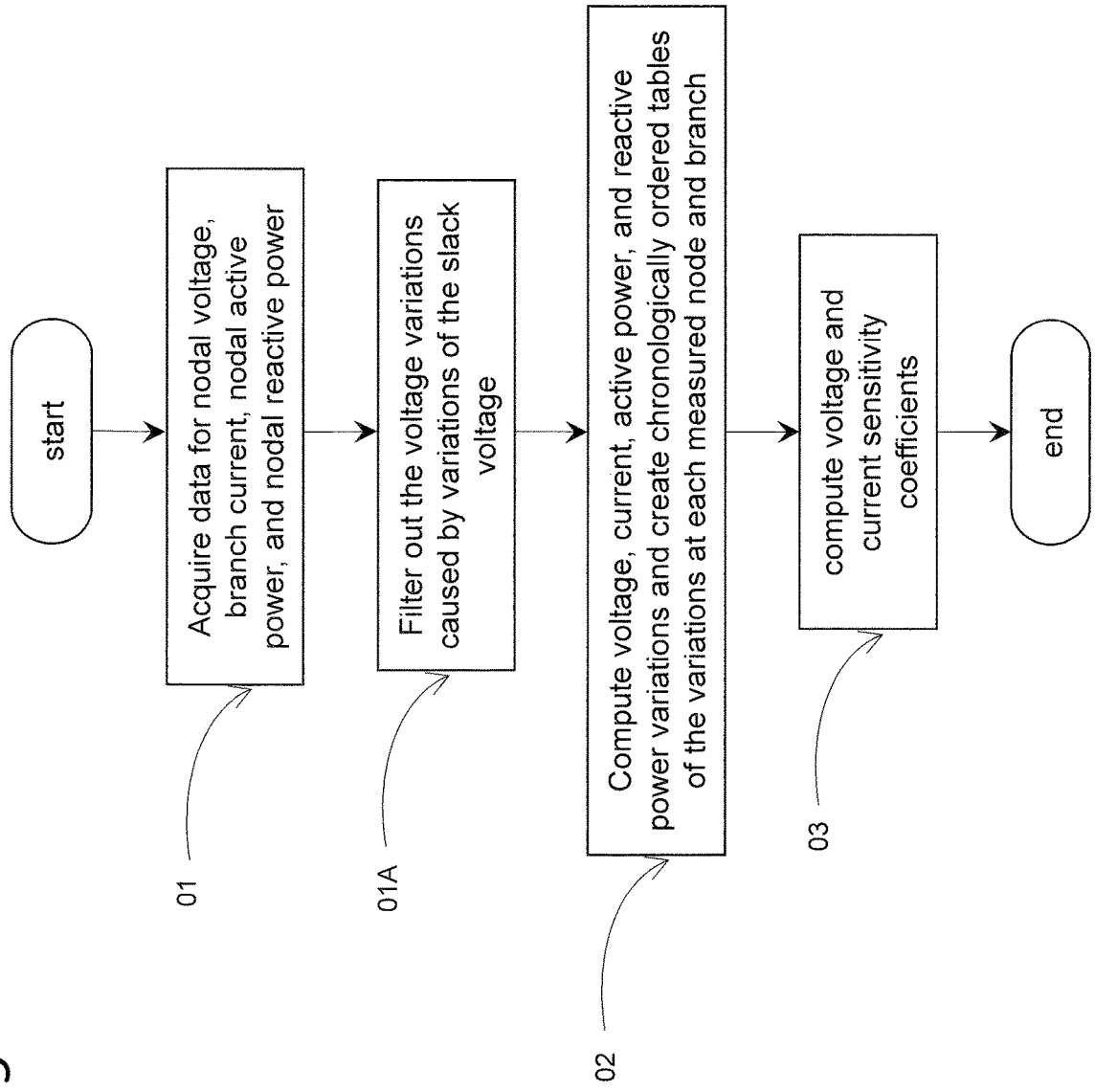
FIG. 9 is a flowchart depicting a third particular implementation of the method of the invention for determining the voltage and current sensitivity coefficients for an electric power network.

FIG. 9 is a flowchart depicting another particular variant of the implementation illustrated by the flowchart of FIG. 7. The distinctive feature of the variant of FIG. 9 is that it comprises an additional step making it possible in particular to filter out voltage variations that are caused in the upper-level grid. As previously mentioned, the low-voltage network 1 is linked to a medium-voltage network 2 by a substation transformer 3. The transformer is connected to network 1 through a switch 4 and a first node N1. The low-voltage network 1 can thus be disconnected from the main portion of the grid by means of the switch 4.

In the field of electric power networks, the condition in which a portion of the utility grid (in the illustrated example, network 1 of FIG. 1) becomes temporarily isolated from the main grid but remains energized by its own distributed generation resources (in the illustrated example, G1, G2, G3 and 6 in FIG. 1) is known as "islanding operation". Islanding may occur accidentally or deliberately. Intentional islanding operation may be desired in cases where the central grid is prone to reliability problems. In this case, the interconnection is designed to permit the particular portion of the grid to continue operating autonomously and provide uninterrupted service to local customers during outages on the main grid. Usually, protective devices must be reconfigured automatically when transitioning between islanded and grid-connected modes.

Referring again to FIG. 1, one can understand that whenever the low-voltage power network 1 operates in the grid-connected mode, any change in voltage supplied to the substation transformer 3 by the medium-voltage network 2 has an impact on the voltages at all the measuring nodes in network 1. As long as the voltage supplied by the medium-voltage network 2 is stable, this voltage can be considered as a reference. However, it should be understood that the voltage levels in the medium-voltage network can also experience changes. Furthermore, the causes for these changes are, for the most part, completely unrelated to events in the connected low-voltage network.

In the following discussion, the level of the voltage that the substation transformer would output if it was an ideal transformer, having zero impedance, is referred to as the "slack voltage" of the transformer. It should be understood that the slack voltage of the transformer is "pegged" to the voltage supplied to the substation transformer by the medium-voltage network 2, or in other words that, in the case of an ideal transformer, the ratio of the output voltage over the input voltage is constant. Again referring to FIG. 1, one will understand that the slack voltage can be computed straightforwardly. Indeed, the first metering unit M1 connects the substation transformer 3 with the node N1 of network 1. It follows that the voltage measured by the metering unit of node M1 is the output voltage from the substation transformer. Furthermore, the measured current and phase difference are also those at the output of the transformer. Knowing the impedance of the transformer (Zcc), the slack voltage is calculated based on the output voltage, the output current and the phase difference between the two.

$$V_{slack}(t) = |\overline{V}_1(t) + \overline{Z}_{CC} \cdot \overline{I}_1(t)|;$$

where variables and factors corresponding to complex numbers are denoted with a bar (e.g., $\overline{Z}_{CC}$).

Comparing the flowchart of FIG. 9 with the flowchart of FIG. 7, it can be seen that it comprises an additional box referred to as box "01A". As previously mentioned, the method step represented by this box is intended for filtering out voltage variations that originate from the upper-level grid. Box "01A" represents the task accomplished by the monitoring infrastructure or system of loading method parameters. According to the presently described implementation, the method parameters comprise a measurement schedule, information as to which metering unit is located at the output of the transformer, as well as to the value of the impedance Zcc of the transformer. Using this information the slack voltage is computed. This task is accomplished either by the processing unit, or directly by the metering unit located at the output of the transformer (node M1 in FIG. 1). The slack-voltage is computed repeatedly, preferably each time the metering unit of the first node M1 measures the voltage, the current and the phase difference. As the sets of data obtained by the first metering unit from each successive measurement are time-stamped, the different computed values for the slack voltage can "inherit" the timestamps associated with the respective sets of data from which the values were computed. The timestamped values of the slack-voltage are subsequently subtracted from the voltages measured at the same time at every measuring node. This subsequent computation can be done either by the processing unit, or by the metering units at each measuring node.

The method of the invention can be implemented for an electric power network capable of transitioning between an islanded and a grid-connected mode of operation. Referring again to the electric power network of FIG. 1, one can observe that, according to the illustrated example, it is the status of the switch 4 that determines in which mode the network 1 is presently operating. In a similar fashion to what was described in relation to FIG. 9, the monitoring infrastructure loads a number of method parameters. As previously described, the method parameters comprise a measurement schedule, information as to which metering unit is located at the output of the transformer, as well as to the value of the impedance of the transformer. Furthermore, the method parameters also comprise the "open" or "closed" status of the switch 4 and the value of the impedance of the diesel powered generator (Xd). Then, the actions of computing and of subtracting the slack voltage of the transformer, is implemented whenever the electric power network is operating in a grid-connected mode. In the opposite situation, when the grid is operating in islanding mode, the method of the present example computes and subtracts the slack voltage of the generator from the voltages measured at the same time at every measuring node. As previously explained, the monitoring infrastructure has access to the status of the switch 4. In the present example, the "open" or "closed" status is loaded into the system with the other method parameters. It should be understood however that the current status of the circuit breaker could alternatively be readable online at any time. In a similar manner to what was previously described in relation to FIG. 9, box "01A" represents the task of computing the slack voltage. This task can be accomplished either by the processing unit or directly by the metering unit located at the output of the transformer (node M1 in FIG. 1). The successive computed values of the slack voltage are then used in order to compute variations of the slack voltage. The variations of the slack voltage are computed simply by subtracting from each value of the slack voltage, the precedent value of the same variable. The computed variations of the slack voltage are subsequently subtracted from the variations of the voltage measured at the same time at every measuring node. This subsequent computation can be done either by the processing unit or by the metering units at each measuring node.

Although the method of the invention has been illustrated and described in greater detail by means of exemplary implementations, the invention is not restricted by the disclosed examples and various alterations and/or improvements could be derived therefrom by a person skilled in the art without departing from the scope of the present invention defined by the annexed claims.

Example

Figure 10:
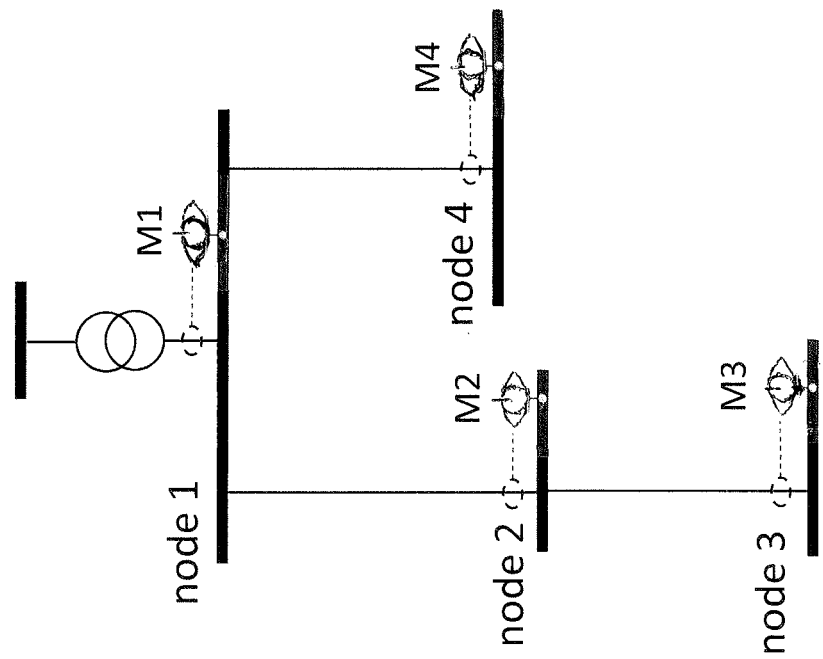
FIG. 10 shows an exemplary network used to determine the voltage and current sensitivity coefficients by means of the method of the invention.

The appended FIG. 10 shows the single-line diagram of a network with four metering units. The corresponding voltage and current sensitivity coefficient matrices are calculated by means of Maximum Likelihood Estimation method as explained above. The computed voltage sensitivity coefficient matrices are the following:

$$KVP = \begin{bmatrix} 0.0120 & 0.0120 & 0.0120 & 0.0120 \\ 0.0120 & 0.0598 & 0.0946 & 0.0120 \\ 0.0120 & 0.0573 & 0.2799 & 0.0120 \\ 0.0120 & 0.0120 & 0.0120 & 0.0346 \end{bmatrix}$$

$$KVQ = \begin{bmatrix} 0.0348 & 0.0348 & 0.0348 & 0.0413 \\ 0.0348 & 0.0963 & 0.0772 & 0.0375 \\ 0.0348 & 0.0995 & 0.0433 & 0.0360 \\ 0.0348 & 0.0348 & 0.0348 & 0.0348 \end{bmatrix}$$

The computed current sensitivity coefficient matrices are the following:

$$KIP = \begin{bmatrix} 4.1177 & 4.0702 & 4.0279 & 4.0882 \\ 0.0000 & 4.0044 & 4.0267 & 0.0000 \\ 0.0000 & 0.0000 & 4.1288 & 0.0000 \\ 0.0000 & 0.0000 & 0.0000 & 3.9805 \end{bmatrix}$$

$$KIQ = \begin{bmatrix} 0.4357 & 0.5190 & 0.6542 & 0.3980 \\ 0.0000 & 0.0000 & 0.3994 & 0.0000 \\ 0.0000 & 0.0000 & 1.0619 & 0.0000 \\ 0.0000 & 0.0000 & 0.0000 & 0.1522 \end{bmatrix}$$

The determined voltage and current sensitivity coefficients reflect the important behavior and characteristics of the power network, and they can be further used for various power network analysis, grid control, energy management, and grid planning applications.

For instance, the determined sensitivity coefficients can be used for the optimal control of distributed controllable resources, such as PV production, e-mobility consumption, heating/cooling consumption, battery storage systems, by specifying explicit active power and reactive power setpoints for the controllable resources while the impacts of the control action on the nodal voltages and the branch currents are properly taken into account. In the case of the voltage sensitivity coefficients given above, and assuming the controllable resource is available at node 2, in case of a voltage deviation of 5 [V] at node 3, the required active power change at node 2 can be calculated using the determined sensitivity coefficients (KVP), as following:

$$\Delta P_2 = \frac{\Delta V_3}{KVP_{32}} = \frac{5}{0.0573} = 87.26 \ [kW]$$

In other words, by changing the active power at node 2 for 87.26 [kW], the voltage at different grid nodes varies as following:

$\Delta V_1 = \Delta P_2 \times KVP_{12} = 87.26 \times 0.0120 = 1.0471 [V]$ $\Delta V_2 = \Delta P_2 \times KVP_{22} = 87.26 \times 0.0598 = 5.2181 [V]$ $\Delta V_3 = \Delta P_2 \times KVP_{32} = 87.26 \times 0.0573 = 5.0000 [V]$ $\Delta V_4 = \Delta P_2 \times KVP_{42} = 87.26 \times 0.0120 = 1.0471 [V]$ Furthermore, the determined current sensitivity coefficients allows evaluating the impact of power changes on the branch currents. For the abovementioned example, the impacts of 87.26 [kW] of the active power change at node 2 on the branch currents are as followings:

$\Delta I_1 = \Delta P_2 \times KIP_{12} = 87.26 \times 4.0702 = 355.2 [A]$ $\Delta I_2 = \Delta P_2 \times KIP_{22} = 87.26 \times 4.0044 = 349.4 [A]$ $\Delta I_3 = \Delta P_2 \times KIP_{32} = 87.26 \times 0 = 0 [A]$ $\Delta I_4 = \Delta P_2 \times KIP_{42} = 87.26 \times 0 = 0 [A]$ If the current flow in branch 1 is 1000 [A] and the maximum allowed current is 1500 [A], the current flow after the active power change is calculated as following, which is less than the maximum allowed current.

$$I_1^{new}=I_1^{old}=\Delta I_1=1000+355.2=1355.2[A]$$

The knowledge of the voltage and current sensitivity coefficients allows determining the active and reactive power set-points of the controllable resources while ensuring the voltages and the currents across the network are within the acceptable limits. The model-less estimation of the voltage and current sensitivity coefficients enables plug and play grid optimal control.

What is claimed:

1. A method for determining sensitivity coefficients of an electric power network and for using said sensitivity coefficients to predict a change of current through any selected branch when an amount of power consumed or produced at a particular measuring node changes, the electric power network comprising a set of nodes and a set of branches, the electric power network (1) further being provided with a monitoring infrastructure comprising metering units at each one of a plurality of nodes (called measuring nodes (N1, . . . , N4)) in the set of nodes, each of one of said metering units being arranged to measure a nodal voltage of one of said measuring nodes, branch currents flowing into or out of said one of said measuring nodes, and respective phase differences between the branch currents and the nodal voltage, said branch currents either flowing through branches of the network that are incident on said one of said measuring nodes or being associated with power injections at said one of said measuring nodes, the monitoring infrastructure further comprising at least one processing unit (7) and a communication infrastructure arranged for allowing communication between the metering units and said at least one processing unit, the method determines current sensitivity coefficients of a plurality of selected branches (A, . . . , D), with respect to the plurality of measuring nodes (N1, . . . , N4) of the electric power network, by carrying out the following steps:

I. having the metering units measure concomitantly, at each one of said measuring nodes (N1, . . . , N4), repeatedly over a time window ($\tau$), sets of data comprising the nodal voltage value $V_n(t)$ and values of branch currents $I_b(t)$ flowing into or out of said one of said measuring nodes, timestamp $t \in \{t_1, \ldots, t_m\}$ the measured sets of data, and compute a timestamped nodal active power value $P_n(t)$ and a timestamped nodal reactive power value $Q_n(t)$ from each set of measured data;

II. for each one of the selected branches (A, . . . , D), computing a variation ($\Delta \widetilde{I_b}(t)$) of the branch current measured in step I (box 01) flowing through said one of the selected branches, by subtracting from a measured value of the branch current flowing through said one of the selected branches, a preceding measured value of the current flowing through said one of the selected branches, and for each one of the measuring nodes, compute concomitant variations ($\Delta \widetilde{P}_n(t), \Delta \widetilde{Q_n}(t)$) of the nodal active and reactive powers computed in step I (box "01") by subtracting from computed values of the nodal active and reactive powers at said one of the measuring nodes, preceding computed values of the nodal active and reactive powers respectively;

III. compiling chronologically ordered tables of the variations of the current ($\Delta \widetilde{I_b}(t)$) through each selected branch (A, . . . , D) in relation to concomitant variations of the active ($\Delta \widetilde{P}_1(t), \ldots, \Delta \widetilde{P_N}(t)$) and reactive powers ($\Delta \widetilde{Q_1}(t), \ldots, \Delta \widetilde{Q_N}(t)$) at all measuring nodes (N1, . . . , N4);

IV. performing a Maximum Likelihood Estimation (MLE) of current sensitivity coefficients ($KIP_{bn}$, $KIQ_{bn}$) linking variations of the current through the selected branches ($\Delta \widetilde{I_b}(t)$), as compiled during step III (box "02"), to the nodal active and reactive power variations ($\Delta P_n(t), \Delta Q_n(t)$), while taking into account serial correlation between error terms corresponding to discrepancies between the actual variations and the variations predicted by the Maximum Likelihood Estimation, and obtain from the determined current sensitivity coefficients ($KIP_{bn}$, $KIQ_{bn}$) current sensitivity coefficient matrices; and V. using at least one of the current sensitivity coefficients in the current sensitivity coefficient matrices to predict a change of the current through any one of the selected branches when the amount of power consumed or produced at a particular measuring node changes.

2. The method for determining sensitivity coefficients of an electric power network according to claim 1, wherein the method further carries out the following additional steps in order to determines mutual voltage sensitivity coefficients between the measuring nodes (N1, . . . , N4) and to use the obtained voltage sensitivity coefficients to predict a voltage change at any particular measuring node when the amount of power consumed or produced at the same or another measuring node of the network changes:

IIIa. compiling chronologically ordered tables of the variations of the voltage ($\Delta \widetilde{V}_n(t)$) at each one of the measuring nodes (N1, . . . , N4) in relation to concomitant variations of the active ($\Delta \widetilde{P}_1(t), \ldots, \Delta \widetilde{P_N}(t)$) and reactive powers ($\Delta \widetilde{Q_1}(t), \ldots, \Delta \widetilde{Q_N}(t)$) at all measuring nodes (N1, . . . , N4);

IVa. performing a Maximum Likelihood Estimation (MLE) of voltage sensitivity coefficients ($KVP_{nn}$, $KVQ_{nn}$) linking the nodal voltage variations $\Delta V_n(t)$, as compiled during step IIIa (box "02"), to the nodal active and reactive power variations ($\Delta P_n(t), \Delta Q_n(t)$), while taking into account serial correlation between error terms corresponding to discrepancies between the actual variations and the variations predicted by the Maximum Likelihood Estimation, and obtain from the determined voltage sensitivity coefficients ($KVP_{nn}$, $KVQ_{nn}$) voltage sensitivity coefficient matrices;

Va. using at least one of the voltage sensitivity coefficients in the voltage sensitivity coefficient matrices to predict a voltage change at any particular measuring node when the amount of power consumed or produced at particular measuring nodes changes.

3. The method for determining sensitivity coefficients of an electric power network according to claim 2, wherein the Maximum Likelihood Estimation of step IVa is implemented in the form of multiple parametric regression.

4. The method for determining sensitivity coefficients of an electric power network according to claim 3, wherein the multiple parametric regression analysis of step IVa is performed while assuming that the correlations between two error terms corresponding to consecutive time-steps are contained in the interval between −0.7 and −0.3, and that the correlations between two error terms corresponding to non-consecutive time-steps are contained in the interval between −0.3 and 0.3.

5. The method for determining sensitivity coefficients of an electric power network according to claim 1, wherein the values of the branch currents contained in the sets of data measured, at some at least of said measuring nodes (N1, ..., N4), during step I are the values of each of the branch currents ($I_{bA}$, $I_{bB}$, $i_{bC}$) flowing through branches (A, B, C) of the network that are incident on any one of said some at least of the measuring nodes.

6. The method for determining sensitivity coefficients of an electric power network according to claim 1, wherein the metering units at each one of said measuring nodes are arranged to measure timestamped sets of data comprising a mean value of the nodal voltage $V_n(t)$ and mean values of the branch currents $I_b(t)$ averaged over at least half a period of the AC power, and respective phase differences ($\varphi_b''(t)$) between the branch currents $I_b(t)$ and the nodal voltage $V_n(t)$, and further to compute timestamped active branch powers $P_b(t)$ and timestamped reactive branch powers $Q_b(t)$ from the nodal voltage, the branch currents and the phase differences contained in each timestamped set of data.

7. The method for determining sensitivity coefficients of an electric power network according to claim 1, wherein the Maximum Likelihood Estimation of step IV is implemented in the form of multiple parametric regression.

8. The method for determining sensitivity coefficients of an electric power network according to claim 7, wherein the multiple parametric regression analysis of step IV is performed while assuming that the correlations between two error terms corresponding to consecutive time-steps are contained in the interval between −0.7 and −0.3, and that the correlations between two error terms corresponding to non-consecutive time-steps are contained in the interval between −0.3 and 0.3.

9. The method for determining sensitivity coefficients of an electric power network according to claim 1, wherein the communication infrastructure comprises a communication network.

10. The method for determining sensitivity coefficients of an electric power network according to claim 9, wherein a preexisting commercial network provided by a mobile operator serves as the communication network.

11. The method for determining sensitivity coefficients of an electric power network according to claim 9, wherein the metering units are synchronized by means of the Network Time Protocol (NTP) via the communication network.

12. The method for determining sensitivity coefficients of an electric power network according to claim 1, wherein the metering units each comprise a controller and a buffer, and steps I and II are integrally implemented in a decentralized manner by the metering units.

13. The method for determining sensitivity coefficients of an electric power network according to claim 12, wherein, after step II has been completed, said at least one processing unit uses the communication infrastructure in order to input timestamped values of the variations computed by the metering unit in step II.

14. The method for determining sensitivity coefficients of an electric power network according to claim 1, wherein the metering units each comprise a controller and working memory, and wherein one of the metering units serves as the processing unit.

\* \* \* \* \*